(12) United States Patent
Kim

(10) Patent No.: US 7,751,257 B2
(45) Date of Patent: Jul. 6, 2010

(54) SEMICONDUCTOR MEMORY DEVICE

(75) Inventor: Myung-Jin Kim, Kyoungki-do (KR)

(73) Assignee: Hynix Semiconductor Inc., Kyounki-do (KR)

( * ) Notice: Subject to any disclaimer, the term of this patent is extended or adjusted under 35 U.S.C. 154(b) by 131 days.

(21) Appl. No.: 12/217,048

(22) Filed: Jun. 30, 2008

(65) Prior Publication Data

US 2009/0116303 A1    May 7, 2009

(30) Foreign Application Priority Data

Nov. 5, 2007   (KR) .................. 10-2007-0112038

(51) Int. Cl.
*G11C 7/00* (2006.01)
(52) U.S. Cl. ............... 365/189.07; 365/205; 365/226
(58) Field of Classification Search .............. None
See application file for complete search history.

(56) References Cited

U.S. PATENT DOCUMENTS

| | | | |
|---|---|---|---|
| 5,610,869 A * | 3/1997 | Yoo et al. | 365/222 |
| 6,392,944 B1 * | 5/2002 | Kono | 365/208 |
| 6,891,773 B2 * | 5/2005 | Park | 365/205 |
| 7,282,986 B2 * | 10/2007 | Kang et al. | 327/536 |
| 7,505,343 B2 * | 3/2009 | Kang | 365/205 |

FOREIGN PATENT DOCUMENTS

| KR | 1994-0016235 | 7/1994 |
|---|---|---|
| KR | 2006-0042353 | 5/2006 |
| KR | 2007-0084785 | 8/2007 |

* cited by examiner

*Primary Examiner*—Tan T. Nguyen
(74) *Attorney, Agent, or Firm*—Blakely, Sokoloff, Taylor & Zafman LLP

(57) ABSTRACT

A semiconductor memory device can generate an under_drive voltage that maintains a predetermined level stably even in case of a change in the operation mode of the semiconductor memory device or the level of an external power supply voltage. The semiconductor memory device, which includes an external power supply voltage detector configured to detect a level of an external power supply voltage to generate the external voltage detection signal, an under_drive voltage detector configured to detect a voltage level of an under_drive voltage to generate the under_drive voltage detection signal, and an under_drive voltage generator configured to generate the under_drive voltage in response to the under_drive voltage detection signal with a variable driving force in response to the external voltage detection signal.

30 Claims, 7 Drawing Sheets

SEMICONDUCTOR MEMORY DEVICE

CROSS-REFERENCE TO RELATED APPLICATIONS

The present invention claims priority of Korean patent application number 10-2007-0112038, filed on Nov. 5, 2007, which is incorporated by reference in its entirety.

BACKGROUND OF THE INVENTION

The present invention relates to a semiconductor memory device, and particularly to a bitline sense amplifier circuit for a semiconductor memory device using an under_drive technique. More particularly, the present invention relates to a bitline sense amplifier circuit for a semiconductor memory device that can perform an under_drive operation stably even in the case of a change in the level of an external power supply voltage.

The continuous scaling-down of a line width and a cell size is accelerating the reduction of the level of a power supply voltage in a semiconductor memory chip, which necessitates design technology for satisfying the performance required in a low-voltage environment.

At the present time, most semiconductor memory chips supply a voltage for an operation of an internal circuit by using an internal voltage generator circuit that generates an internal voltage by the use of an external voltage (i.e., a power supply voltage). Particularly, memory devices using a bitline sense amplifier, such as DRAMs, use a core voltage VCORE and a ground voltage VSS to detect cell data.

When an wordline is selected and enabled by a row address, data of memory cells connected to the selected wordline are transferred to bitlines and a bitline sense amplifier senses and amplifies a voltage difference between a pair of bitlines.

In general, because thousands of bitline sense amplifiers operate at the same time, a large amount of current is supplied to a ground voltage terminal VSS, which is used to drive pull-down power lines (generally called 'SB') of the bitline sense amplifiers, at a time. This causes a sudden increase in the voltage level of the ground voltage terminal VSS.

However, a logic decision level for determining whether cell data are logic 'high' or logic 'low' decreases as the level of a power supply voltage for operating bitline sense amplifiers decreases.

Thus, the level of a ground voltage VSS, which increases suddenly during the operation of bitline sense amplifiers, becomes higher than the logic decision level. In this case, a logic 'low' level of cell data may be misinterpreted as a logic 'high' level that indicates the need of amplification of the cell data level.

An under_drive technique has been adopted to overcome the above limitation. The under_drive technique drives a pull-down power line of a bitline sense amplifier (i.e., an SB power line) by an under_drive voltage VBB2, which is lower than a ground voltage VSS and is generally between a back-bias voltage VBB and the ground voltage VSS, for a predetermined time at an initial operation stage of the bitline sense amplifier (i.e., at a stage after charge-sharing between a cell and a bit line).

FIG. 1 is a circuit diagram of a conventional bitline sense amplifier circuit using an under_drive technique.

Referring to FIG. 1, the conventional bitline sense amplifier circuit using an under_drive technique includes a bitline sense amplifier 110, an upper bitline equalizer 120, a lower bitline equalizer 170, an upper bitline separator 130, a lower bitline separator 150, a bitline precharger 140, a column selector 160, and a bitline sense amplifier power line driver 100, regardless of the use of the under_drive technique.

The upper bitline separator 130 separates/connects an upper memory cell array and the bitline sense amplifier 110 in response to an upper bitline separation signal BISH. Likewise, the lower bitline separator 150 separates/connects a lower memory cell array and the bitline sense amplifier 110 in response to a lower bitline separation signal BISL.

When an enable signal is activated to drive a pull-down power line SB and a pull-up power line RTO at a predetermined voltage level, the bitline sense amplifier 110 senses a voltage difference between a pair of bitlines BL and BLB, which are in a charge-sharing state and have a minute voltage difference therebetween, and amplifies a voltage of one of the bitlines BL and BLB and a voltage of the other of the bitlines BL and BLB respectively to a ground voltage VSS and a core voltage VCORE.

The upper bitline equalizer 120, the lower bitline equalizer 170, and the bitline precharger 140 precharge the bitlines BL and BLB with a bitline precharge voltage VBLP, which is generally VCORE/2, in response to a bitline equalization signal BLEQ, after the completion of the sensing/amplifying and re-storing operations on the bitlines.

When a read command is applied, the column selector 160 transfers data, which are sensed/amplified by the bitline sense amplifier 110, to segment data buses SIO and SIOB in response to a column selection signal YI. On the other hand, when a write command is applied, the column selector 160 transfers external input data to an upper memory cell or a lower memory cell in response to a column selection signal YI.

The bitline sense amplifier power line driver 100 includes a normal pull-up power line driver 102, an overdrive pull-up power line driver 103, a normal pull-down power line driver 106, and an under_drive pull-down power line driver 107. The normal pull-up power line driver 102 drives the pull-up power line RTO by the core voltage VCORE in response to a normal pull-up power line drive control signal SAP1. The overdrive pull-up power line driver 103 drives the pull-up power line RTO by an external power supply voltage VDD or a pumping voltage VPP in response to an overdrive pull-up power line drive control signal SAP2. The normal pull-down power line driver 106 drives the pull-down power line SB by the ground voltage VSS in response to a normal pull-down power line drive control signal SAN1. The under_drive pull-down power line driver 107 drives the pull-down power line SB by an under_drive voltage VBB2 in response to an under_drive pull-down power line drive control signal SAN2.

Herein, the normal pull-up power line drive control signal SAP1 and the overdrive pull-up power line drive control signal SAP2 are defined as 'low' active pulses and thus PMOS transistors P1 and P2 are used to drive the pull-up power line RTO. This, however, is merely exemplary and NMOS transistors may also be used to drive the pull-up power line RTO.

Likewise, the normal pull-down power line drive control signal SAN1 and the under_drive pull-down power line drive control signal SAN2 are defined as 'high' active pulses and thus NMOS transistors N1 and N2 are used to drive the pull-down power line SB. This, however, is merely exemplary and PMOS transistors may also be used to drive the pull-down power line SB.

FIG. 2 is a signal timing diagram illustrating an operation of the conventional bitline sense amplifier circuit illustrated in FIG. 1.

Referring to FIG. 2, the operation of the conventional bitline sense amplifier can be divided as follows:

Because data stored in a cell array are not yet transferred to the bitlines BL and BLB, the bitlines BL and BLB maintain a precharge voltage HALF_VCORE (e.g., 0.55 V) at an initial operation stage (①).

Thereafter, when the data stored in the cell array are transferred to the bitlines BL and BLB, the bitlines BL and BLB have a minute voltage level difference therebetween for a predetermined time (②).

Thereafter, when the voltage level difference between the bitlines BL and BLB is a predetermined value or more due to the data transferred from the cell array, the bitline sense amplifier 110 performs a sense/amplification operation such that the bitlines BL and BLB have a large voltage level difference therebetween (③).

The pull-up power line RTO and the pull-down power line SB must be driven already when the bitline sense amplifier 110 starts to operate. The bitline sense amplifier circuit illustrated in FIG. 1 uses both of an overdrive technique and an under_drive technique. Therefore, during the sense/amplification operation, the voltage of the bitline BL is suddenly amplified up to a level corresponding to the under_drive voltage VBB2 (④) and the voltage of the bitline BLB suddenly increases up to a level corresponding to the external power supply voltage VDD (⑤).

In this way, by using not only the overdrive technique but also the under_drive technique, the conventional bitline sense amplifier circuit for a semiconductor memory device can stably perform a bitline sense/amplification operation even when the level of the external power supply voltage VDD decreases.

However, because the under_drive voltage VBB2 must be lower than the ground voltage VSS and higher than the back-bias voltage VBB, the conventional bitline sense amplifier circuit must additionally generate the under_drive voltage VBB2 in order to use the under_drive technique in a general semiconductor memory device.

FIG. 3 is a block diagram of an under_drive voltage generating unit for generating an under_drive voltage in a conventional bitline sense amplifier circuit using an under_drive technique.

Referring to FIG. 3, the under_drive voltage generating unit for generating an under_drive voltage VBB2 includes an under_drive voltage detector 300 and an under_drive voltage generator 320. The under_drive voltage detector 300 detects the level of an under_drive voltage VBB2. The under_drive voltage generator 320 generates the under_drive voltage VBB2 in response to an output signal VBB2_DET of the under_drive voltage detector 300.

The under_drive voltage generator 320 includes an oscillator 322 and a pumping unit 324. The oscillator 322 generates an oscillation signal OSC in response to the output signal VBB2_DET of the under_drive voltage detector 300. The pumping unit 324 generates the under_drive voltage VBB2 by performing a charge pumping operation in response to the oscillation signal OSC of the oscillator 322.

However, as described above, the under_drive voltage generating unit is configured to generate the under_drive voltage VBB2 that maintains a predetermined voltage level regardless of a change in the level of the external power supply voltage VDD or the operation of a semiconductor memory device.

Thus, in order to stably perform an under_drive operation, the under_drive voltage generating unit must generate the under_drive voltage VBB2 by the corresponding driving force when the under_drive voltage VBB2 is most used in the semiconductor memory device, that is, when all the banks included in the semiconductor memory device perform a sense/amplification operation at the same time.

However, if a constant driving force (i.e., the strongest driving force) is always used to generate the under_drive voltage VBB2 even when there is a change in the number of banks performing an operation of the semiconductor memory device, particularly a sense/amplification operation, the under_drive voltage VBB2 is generated by the driving force more than necessary, which causes a waste of current.

For example, if the number of banks performing a sense/amplification operation is half of the number of all the banks included in the semiconductor memory device, it is unnecessary to generate the under_drive voltage VBB2 by the driving force corresponding to the case where all the banks included in the semiconductor memory device perform a sense/amplification operation at the same time.

Also, the level of the external power supply voltage VDD may become lower than a predetermined voltage level due to a change in the PVT (process, voltage and temperature) of the semiconductor memory device. In this case, the under_drive voltage VBB2 may have a voltage level lower than the predetermined voltage level because a predetermined driving force fails to be maintained.

If the under_drive voltage VBB2 may have a voltage level lower than the predetermined voltage level, that is, if the under_drive voltage VBB2 has a voltage level similar to the level of the ground voltage VSS, the conventional bitline sense amplifier may misinterpret a logic 'low' level of cell data as a logic 'high' level that indicates the need of amplification of the cell data level. That is, there is no effect of the use of an under_drive technique.

SUMMARY OF THE INVENTION

Embodiments of the present invention are directed to providing bitline sense amplifier circuits for a semiconductor memory device using an under_drive technique, which can generate an under_drive voltage that maintains a predetermined level stably even in case of a change in the operation mode of the semiconductor memory device or the level of an external power supply voltage.

In accordance with an aspect of the present invention, there is provided a semiconductor memory device, which includes a bitline sense amplifier configured to sense/amplify data loaded on a bitline and perform a pull-down driving operation using a normal pull-down driving voltage and an under_drive voltage having a lower level than the normal pull-down driving voltage, an external power supply voltage detector configured to detect a level of an external power supply voltage to generate the external voltage detection signal, an under_drive voltage detector configured to detect a voltage level of the under_drive voltage to generate the under_drive voltage detection signal, and an under_drive voltage generator configured to generate the under_drive voltage in response to the under_drive voltage detection signal with a variable driving force in response to the external voltage detection signal.

In accordance with another aspect of the present invention, there is provided a semiconductor memory device, which includes a plurality of banks each having a bitline sense amplifier configured to sense/amplify data loaded on a bitline and perform a pull-down driving operation using a normal pull-down driving voltage of and an under_drive voltage having a lower level than the normal pull-down driving voltage, an external power supply voltage detector configured to detect the level of an external power supply voltage to generate an external voltage detection signal, an under_drive voltage detector configured to detect the voltage level of an under_drive voltage to generate an under_drive voltage detection signal, and an under_drive voltage generator configured to generate the under_drive voltage in response to the under_drive voltage detection signal with a variable driving force in response to the external voltage detection signal and an active signal corresponding to an active operation of each of the banks.

In accordance with further aspect of the present invention, there is provided a method for driving a semiconductor memory device, which includes sensing/amplifying data loaded on a bitline through performing a pull-down driving operation using a normal pull-down driving voltage and an under_drive voltage having a lower level than the normal pull-down driving voltage, detecting the level of an external power supply voltage to generate an external voltage detection signal, detecting the level of an under_drive voltage to generate an under_drive voltage detection signal, and generating the under_drive voltage in response to the under_drive voltage detection signal with a variable driving force in response to the external voltage detection signal.

DESCRIPTION OF SPECIFIC EMBODIMENTS

Hereinafter, a semiconductor memory device in accordance with the present invention will be described in detail with reference to the accompanying drawings.

Figure 1:
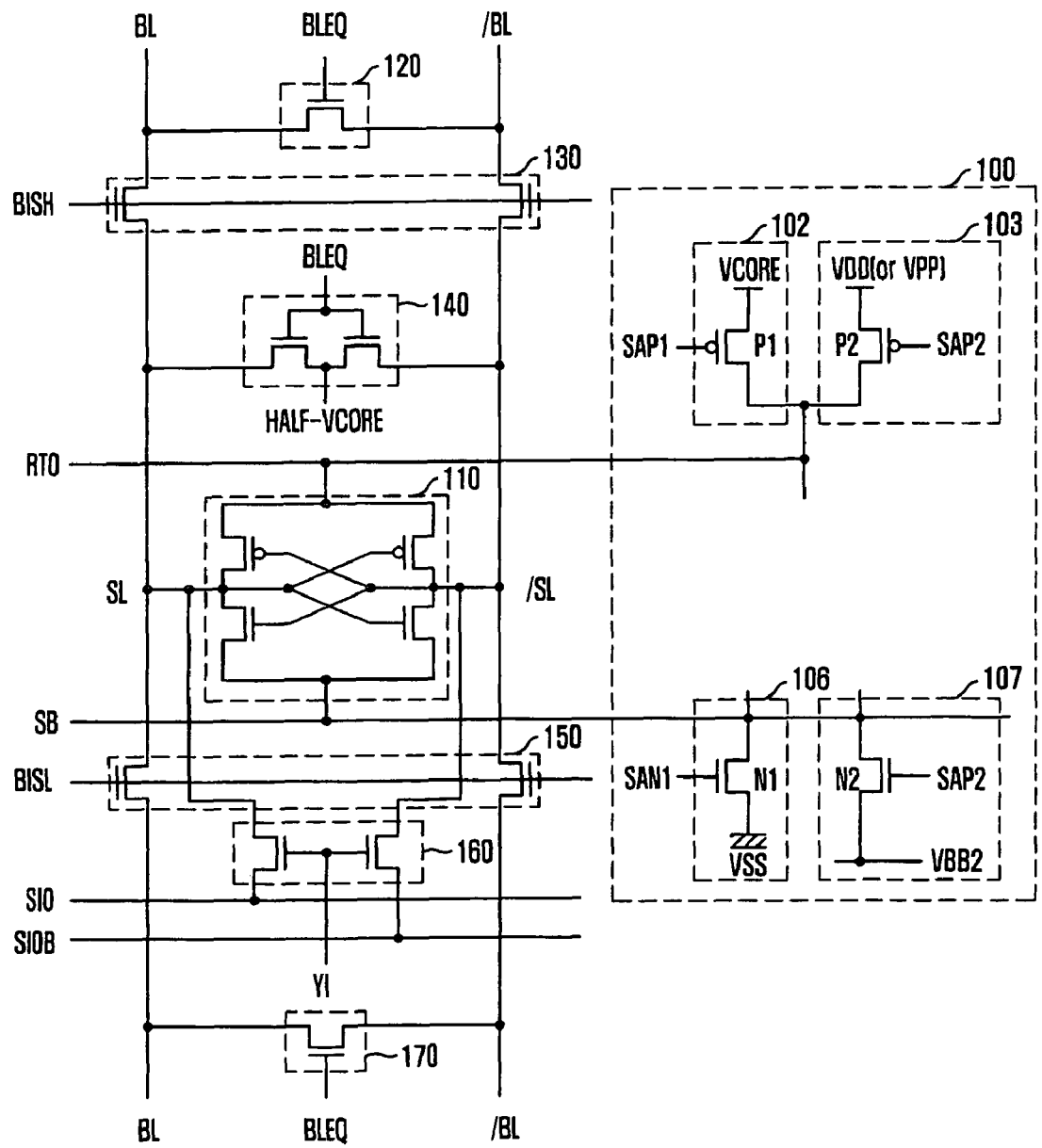
FIG. 1 is a circuit diagram of a conventional bitline sense amplifier circuit using an under_drive technique.
Figure 2:
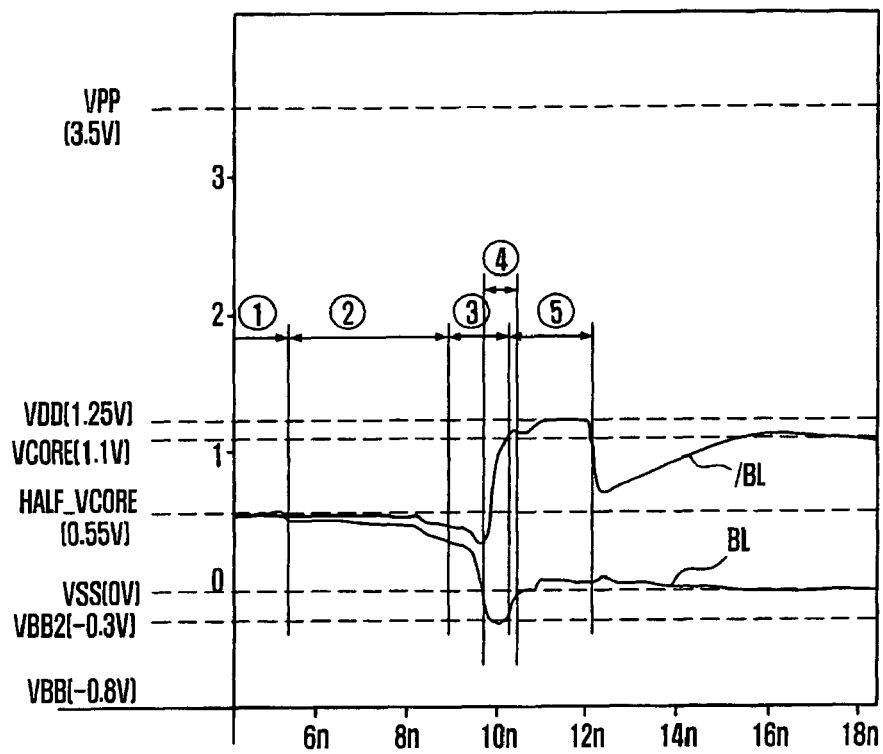
FIG. 2 is a signal timing diagram illustrating an operation of the conventional bitline sense amplifier circuit illustrated in FIG. 1.
Figure 3:
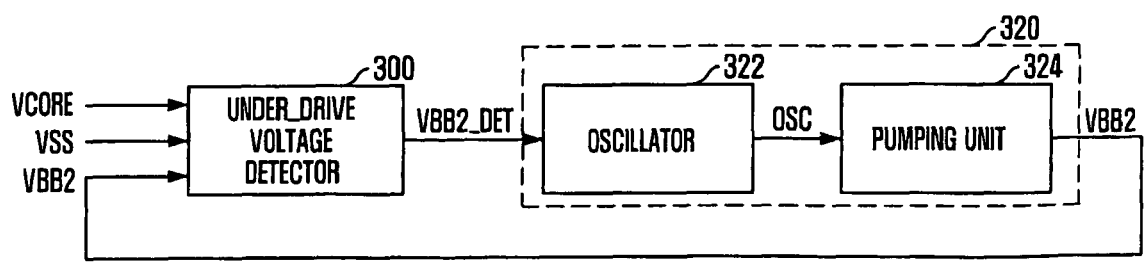
FIG. 3 is a block diagram of an under_drive voltage generating unit of a conventional bitline sense amplifier circuit using an under_drive technique.
Figure 4:
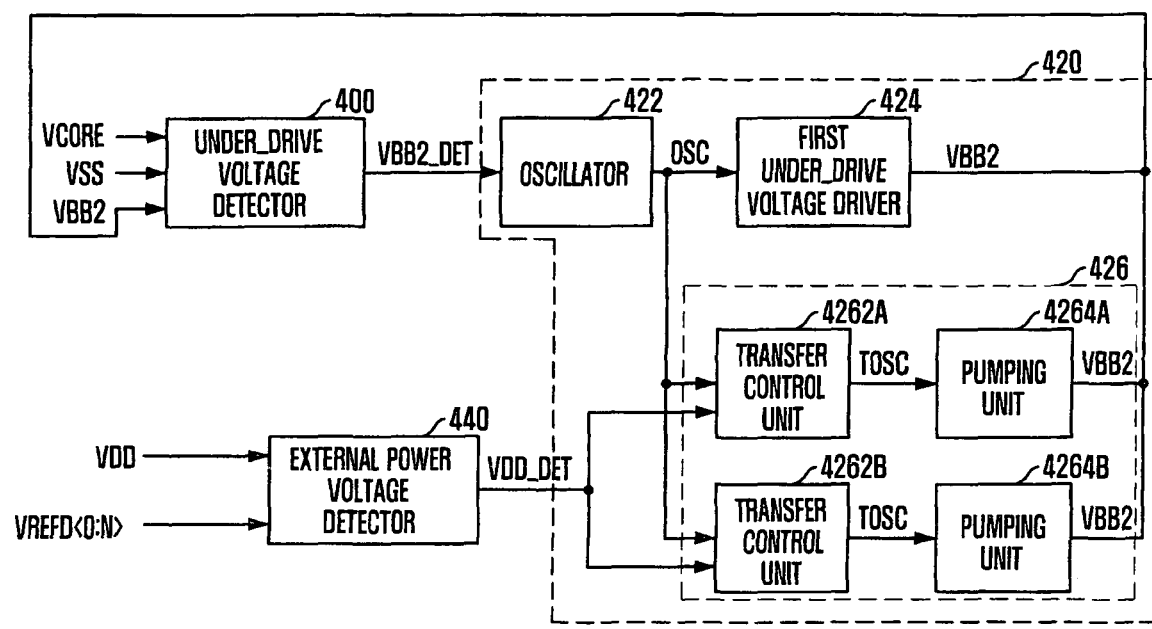
FIG. 4 is a block diagram of an under_drive voltage generating unit of a bitline sense amplifier circuit using an under_drive technique in accordance with a first embodiment of the present invention.

FIG. 4 is a block diagram of an under_drive voltage generating unit of a bitline sense amplifier circuit using an under_drive technique in accordance with a first embodiment of the present invention.

Referring to FIG. 4, the under_drive voltage generating unit for generating an under_drive voltage VBB2 includes an external power supply voltage detector 440, an under_drive voltage detector 400, and an under_drive voltage generator 420. The external power supply voltage detector 440 detects the level of an external power supply voltage VDD. The under_drive voltage detector 400 detects a voltage level of an under_drive voltage VBB2. The under_drive voltage generator 420 generates the under_drive voltage VBB2 in response to an output signal VBB2_DET of the under_drive voltage detector 400. Herein, the under_drive voltage generator 420 drives the under_drive voltage terminal (VBB2) by a variable driving force in response to an output signal VDD_DET of the external power supply voltage detector 440.

The under_drive voltage generator 420 includes an oscillator 422, a first under_drive voltage driver 424, and a second under_drive voltage driver 426. The oscillator 422 generates an oscillation signal OSC with a predetermined frequency in response to the output signal VBB2_DET of the under_drive voltage detector 400. The first under_drive voltage driver 424 drives the under_drive voltage terminal (VBB2) by a first predetermined driving force in response to the oscillation signal OCS of the oscillator 422. The second under_drive voltage driver 426 drives the under_drive voltage terminal (VBB2) by a second predetermined driving force in response to the output signal VDD_DET of the external power supply voltage detector 440 and the oscillation signal OCS of the oscillator 422.

The first under_drive voltage driver 424 of the under_drive voltage generator 420 includes a voltage pumping unit (not shown for the sake of brevity) that drives the under_drive voltage terminal (VBB2) by the first predetermined driving force by performing a charge pumping operation in response to the oscillation signal OSC of the oscillator 422. That is, the first under_drive voltage driver 424 includes only a circuit for charge-pumping the under_drive voltage terminal (VBB2).

The second under_drive voltage driver 426 of the under_drive voltage generator 420 includes transfer control units 4262A/4262B and pumping units 4264A/4264B. Herein, the transfer control units 4262A/4262B control the transfer of the oscillation signal OSC in response to the output signal VDD_DET of the external power supply voltage detector 440, and the pumping unit 4264A/4264B drive the under_drive voltage terminal (VBB2) by the second predetermined driving force by performing a charge pumping operation in response to an output signal TOSC of the transfer control unit 4262A/4262B. That is, the second under_drive voltage driver 426 includes not only a circuit for charge-pumping the under_drive voltage terminal (VBB2), but also a circuit for transferring the oscillation signal OSC selectively according to the level of the external power supply voltage VDD.

An operation for generating the under_drive voltage VBB2 in the bitline sense amplifier circuit using an under_drive technique in accordance with the first embodiment of the present invention can be summarized as follows.

When the level of the external power supply voltage VDD is equal to or higher than a predetermined level, only the first under_drive voltage driver 424 operates to drive the under_drive voltage terminal (VBB2) by the first predetermined driving force.

On the other hand, when the level of the external power supply voltage VDD is lower than the predetermined level, not only the first under_drive voltage driver 424 but also the second under_drive voltage driver 426 operates to drive the under_drive voltage terminal (VBB2) by the sum of the first predetermined driving force and the second predetermined driving force.

Figure 5:
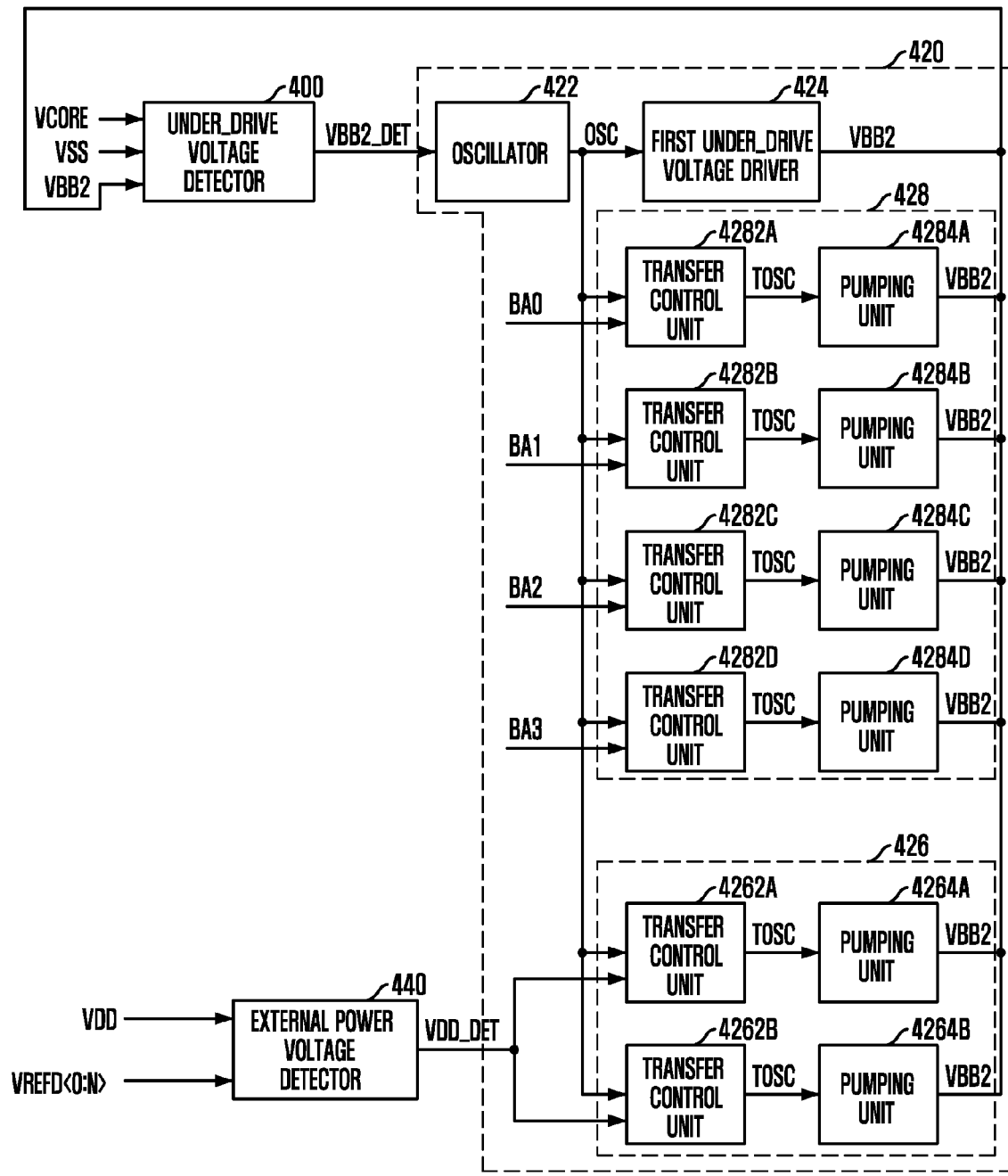
FIG. 5 is a block diagram of the under_drive voltage generating unit illustrated in FIG. 4 in accordance with a second embodiment of the present invention.

FIG. 5 is a block diagram of the under_drive voltage generating unit for generating an under_drive voltage VBB2 in accordance with a second embodiment of the present invention.

Referring to FIG. 5, the under_drive voltage generating unit for generating the under_drive voltage VBB2 includes a plurality of banks (not shown for the sake of brevity), an external power supply voltage detector 440, an under_drive voltage detector 400, and an under_drive voltage generator 420. The external power supply voltage detector 440 detects the level of an external power supply voltage VDD. The under_drive voltage detector 400 detects a voltage level of an under_drive voltage VBB2. The under_drive voltage generator 420 generates the under_drive voltage VBB2 in response to an output signal VBB2_DET of the under_drive voltage detector 400. Herein, the under_drive voltage generator 420 drives the under_drive voltage terminal (VBB2) by a variable driving force in response to an output signal VDD_DET of the external power supply voltage detector 440 and active signals BA0, BA1, BA2 and BA3 corresponding to the active operations of the banks.

The under_drive voltage generator 420 includes an oscillator 422, a first under_drive voltage driver 424, a second under_drive voltage driver 426, and a third under_drive voltage driver 428. The oscillator 422 generates an oscillation signal OSC with a predetermined frequency in response to the output signal VBB2_DET of the under_drive voltage detector 400. The first under_drive voltage driver 424 drives the under_drive voltage terminal (VBB2) by a first predetermined driving force in response to the oscillation signal OCS of the oscillator 422. The second under_drive voltage driver 426 drives the under_drive voltage terminal (VBB2) by a second predetermined driving force in response to the output signal VDD_DET of the external power supply voltage detector 440 and the oscillation signal OCS of the oscillator 422. The third under_drive voltage driver 428 drives the under_drive voltage terminal (VBB2) by a third variable driving force in response to the active signals BA0, BA1, BA2 and BA3 corresponding to the active operations of the banks and the oscillation signal OCS of the oscillator 422.

The first under_drive voltage driver 424 of the under_drive voltage generator 420 includes a voltage pumping unit that drives the under_drive voltage terminal (VBB2) by the first predetermined driving force by performing a charge pumping operation in response to the oscillation signal OSC of the oscillator 422. That is, the first under_drive voltage driver 424 includes only a circuit for charge-pumping the under_drive voltage terminal (VBB2).

The second under_drive voltage driver 426 of the under_drive voltage generator 420 includes transfer control units 4262A/4262B and pumping units 4264A/4264B. Herein, the transfer control units 4262A/4262B control the transfer of the oscillation signal OSC in response to the output signal VDD_DET of the external power supply voltage detector 440, and the under_drive voltage pumping units 4264A/4264B drive the under_drive voltage terminal (VBB2) by the second predetermined driving force by performing a charge pumping operation in response to an output signal TOSC of the transfer control unit 4262A/4262B. That is, the second under_drive voltage driver 426 includes not only a circuit for charge-pumping the under_drive voltage terminal (VBB2), but also a circuit for transferring the oscillation signal OSC selectively according to the level of the external power supply voltage VDD.

The third under_drive voltage driver 428 of the under_drive voltage generator 420 includes a plurality of transfer control units 4282A/4282B/4282C/4282D and a plurality of pumping units 4284A/4284B/4284C/4284D. Herein, the transfer control units 4282A/4282B/4282C/4282D control the transfer of the oscillation signal OSC respectively in response to the active signals BA0/BA1/BA2/BA3 corresponding to the active operations of the banks. The pumping units 4284A/4284B/4284C/4284D drive the under_drive voltage terminal (VBB2) by the third variable driving force by performing a charge pumping operation respectively in response to output signals TOSC of the transfer control units 4282A/4282B/4282C/4282D. That is, the third under_drive voltage driver 428 includes not only a circuit for charge-pumping the under_drive voltage terminal (VBB2), but also a circuit for transferring the oscillation signal OSC selectively in response to the active signals BA0, BA1, BA2 and BA3 corresponding to the active operations of the banks.

An operation for generating the under_drive voltage VBB2 in the bitline sense amplifier circuit using an under_drive technique in accordance with the second embodiment of the present invention can be summarized as follows.

When the level of the external power supply voltage VDD is equal to or higher than a predetermined level, the first under_drive voltage driver 424 operates to drive the under_drive voltage terminal (VBB2) by the first predetermined driving force and simultaneously the under_drive voltage terminal (VBB2) is driven by the third variable driving force according to the number of enabled banks out of the banks. That is, when the level of the external power supply voltage VDD is equal to or higher than a predetermined level, the under_drive voltage terminal (VBB2) is driven by the sum of the first predetermined driving force and the third variable driving force.

On the other hand, when the level of the external power supply voltage VDD is lower than the predetermined level, not only the first under_drive voltage driver 424 but also the second under_drive voltage driver 426 operates to drive the under_drive voltage terminal (VBB2) by the sum of the first predetermined driving force and the second predetermined driving force and simultaneously the under_drive voltage terminal (VBB2) is driven by the third variable driving force according to the number of enabled banks out of the banks. That is, when the level of the external power supply voltage VDD is lower than the predetermined level, the under_drive voltage terminal (VBB2) is driven by the sum of the first predetermined driving force, the second predetermined driving force, and the third variable driving force.

Figure 6:
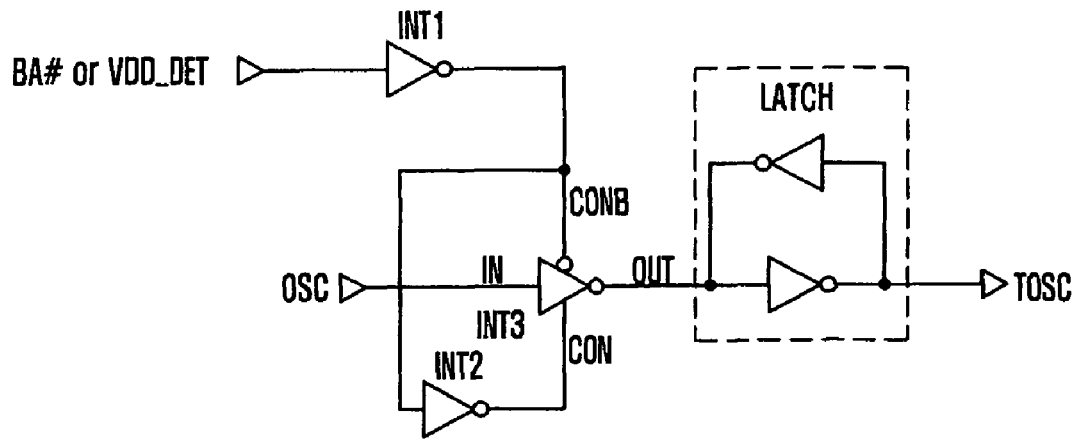
FIG. 6 is a circuit diagram of a transfer control unit for controlling the transfer of an oscillation illustrated in FIGS. 4 and 5.

FIG. 6 is a circuit diagram of the transfer control unit for controlling the transfer of the oscillation signal OSC illustrated in FIGS. 4 and 5.

Referring to FIG. 6, the transfer control unit 4262/4282 for controlling the transfer of the oscillation signal OSC during the generation of the under_drive voltage VBB2 in the bitline sense amplifier circuit in accordance with the embodiment of the present invention includes a first inverter INT1, a second inverter INT2, a third inverter INT3, and a latch LATCH. The first inverter INT1 receives and inverts the output signal VDD_DET of the external power supply voltage detector 440 and the active signal BA# (respectively in 4262 and 4282). The second inverter INT2 receives and inverts an output signal of the first inverter INT1. The third inverter INT3 selectively transfers the oscillation signal OSC, which is applied to an input terminal IN, to an output terminal OUT in response to the output signal of the first inverter INT1 that is received through a negative control terminal CONB and an output signal of the second inverter INT2 that is received through a positive control terminal CON. The latch LATCH is connected in series to the output terminal OUT to prevent the floating of the oscillation signal OSC and invert the phase of the oscillation signal OSC.

Figure 7:
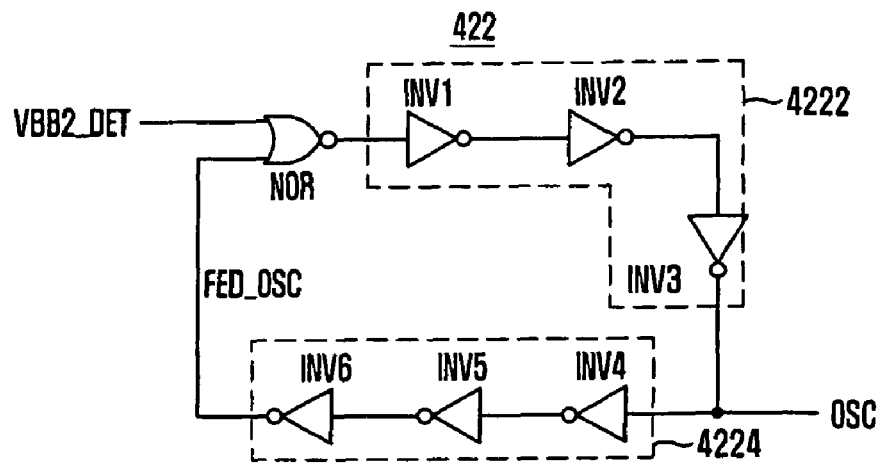
FIG. 7 is a circuit diagram of an oscillator for generating an oscillation signal illustrated in FIGS. 4 and 5.

FIG. 7 is a circuit diagram of the oscillator for generating the oscillation signal OSC illustrated in FIGS. 4 and 5.

Referring to FIG. 7, the oscillator 422 for generating the oscillation signal OSC during the generation of the under_drive voltage VBB2 in the bitline sense amplifier circuit in accordance with the embodiment of the present invention includes a NOR gate NOR, an oscillation signal output unit 4222, and a feedback oscillation signal output unit 4224. The NOR gate NOR performs a NOR operation on a feedback oscillation signal FED_OSC and the output signal VBB2_DET of the under_drive voltage detector 400. The oscillation signal output unit 4222 includes a chain of inverters INT1, INT2 and INT3 that are connected in series to output the oscillation signal OSC by delaying an output signal of the NOR gate NOR by a predetermined time. The feedback oscillation signal output unit 4224 includes a chain of inverters INT4, INT5 and INT6 that are connected in series to output the feedback oscillation signal FED_OSC by delaying the oscillation signal OSC from the oscillation signal output unit 4222 by a predetermined time.

Figure 8:
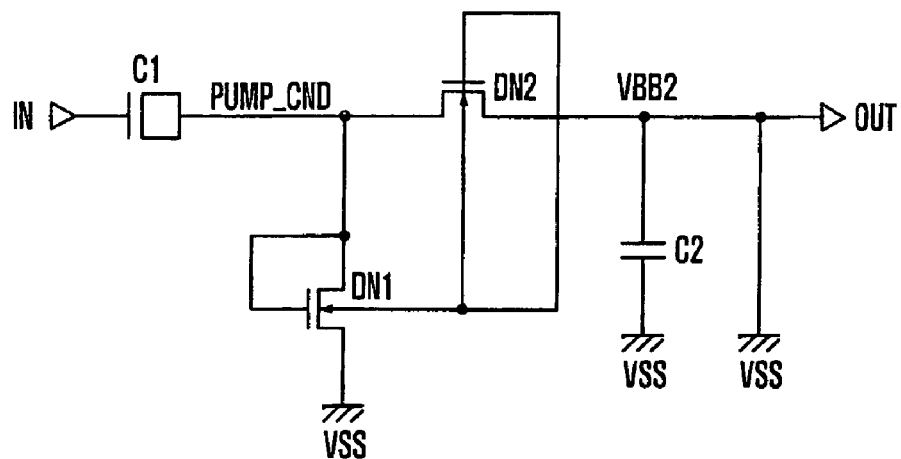
FIG. 8 is a circuit diagram of a pumping unit for charge-pumping an under_drive voltage terminal illustrated in FIGS. 4 and 5.

FIG. 8 is a circuit diagram of the pumping unit for charge-pumping the under_drive voltage terminal VBB2 illustrated in FIGS. 4 and 5.

Referring to FIG. 8, the pumping unit 4264/4284 for charge-pumping the under_drive voltage terminal VBB2 during the generation of the under_drive voltage VBB2 in the bitline sense amplifier circuit in accordance with the embodiment of the present invention includes a first capacitor C1, a first diode-connected NMOS transistor DN1, a second diode-connected NMOS transistor DN2, and a second capacitor C2. The first capacitor C1 is connected in series to a signal input terminal IN such that a change in the voltage level of the signal input terminal IN occurs at a pumping control node PUMP_CND at a rate corresponding to a first predetermined time constant ($\tau$). The first diode-connected NMOS transistor DN1 is connected in series between the pumping control node PUMP_CND and a ground voltage terminal (VSS). The second diode-connected NMOS transistor DN2 is connected in series between the pumping control node PUMP_CND and the under_drive voltage terminal (VBB2) connected in series to the ground voltage terminal (VSS). The second capacitor C2 is connected in series between the under_drive voltage terminal (VBB2) and the ground voltage terminal (VSS) such that a change in the voltage level of the under_drive voltage terminal (VBB2) occurs at a rate corresponding to a second predetermined time constant.

An operation of the pumping unit 4264/4284 will be described below. A signal applied to the signal input terminal IN is the output signal TOSC of the transfer control unit 4262/4282 or the oscillation signal OSC that toggles between a logic 'High' level and a logic 'Low' level or maintains a logic 'high' level or a logic 'low' level. Herein, an operation of charge-pumping the under_drive voltage terminal (VBB2) occurs when the signal applied to the signal input terminal IN toggles between the logic 'High' level and the logic 'Low' level at a predetermined frequency.

Herein, when being logically 'high', the oscillation signal OSC and the output signal TOSC of the transfer control unit 4262/4282 have the same level as the external power supply voltage VDD. On the other hand, when being logically 'low', the oscillation signal OSC and the output signal TOSC of the transfer control unit 4262/4282 have the same level as the ground voltage VSS.

Specifically, when the signal applied to the signal input terminal IN is logically 'high' at an initial stage, the level of the pumping control node PUMP_CND increases toward the level of the external power supply voltage VDD. Thereafter, when the signal applied to the signal input terminal IN is higher in level than a threshold voltage (Vth_n1) of the first diode-connected NMOS transistor DN1, the first diode-connected NMOS transistor DN1 is turned on and thus the level of the pumping control node PUMP_CND decreases toward the level of the threshold voltage (Vth_n1) of the first diode-connected NMOS transistor DN1. Herein, the voltage level of the pumping control node PUMP_CND changes at a rate corresponding to a time constant ($\tau$) of the first capacitor C1.

Thereafter, when the signal applied to the signal input terminal IN is logically 'low', the level of the pumping control node PUMP_CND is equal to the sum (−VDD+Vth_n1) of the previous level (Vth_n1) of the pumping control node PUMP_CND and the level reduction width (31 VDD) of the signal input terminal IN, which is equal to −VDD because the level of the signal input terminal IN decreases from the external power supply voltage level (VDD) to the ground voltage level VSS. In this way, when the level of the pumping control node PUMP_CND changes, the first diode-connected NMOS transistor DN1 is turned off and the second diode-connected NMOS transistor DN2 is turned on.

For reference, the voltage level of the under_drive voltage terminal (VBB2) before the turning on of the second diode-connected NMOS transistor DN2 is equal to the level of the ground voltage VSS because the ground voltage terminal (VSS) is connected in series to the under_drive voltage terminal (VBB2).

Thus, when the second diode-connected NMOS transistor DN2 is turned on, the voltage level of the under_drive voltage terminal (VBB2) is equal to the sum ((−VDD+Vth_n1)+(−VDD−Vth_n2)) of the voltage level (−VDD+Vth_n1) of the pumping control node PUMP_CND and the difference (−VDD−Vth_n2) between the threshold voltage (Vth_n2) of the second diode-connected NMOS transistor DN2 and the voltage level difference (−VDD) between the pumping control node PUMP_CND and the under_drive voltage terminal (VBB2), which is the difference between the pumping control node PUMP_CND voltage levels (−VDD+Vth_n1) and (VSS−Vth_n2) and thus is equal to −VDD when assuming that the threshold voltage (Vth_n1) of the first diode-connected NMOS transistor DN1 is equal to the threshold voltage (Vth_n2) of the second diode-connected NMOS transistor DN2. Thus, assuming that the threshold voltage (Vth_n1) of the first diode-connected NMOS transistor DN1 is equal to the threshold voltage (Vth_n2) of the second diode-connected NMOS transistor DN2, the voltage level ((−VDD+Vth_n1)+(−VDD−Vth_n2)) of the under_drive voltage terminal (VBB2) is equal to −2VDD. Herein, the voltage level of the under_drive voltage terminal (VBB2) changes at a rate corresponding to a time constant ($\tau$) of the second capacitor C2.

Figure 9:
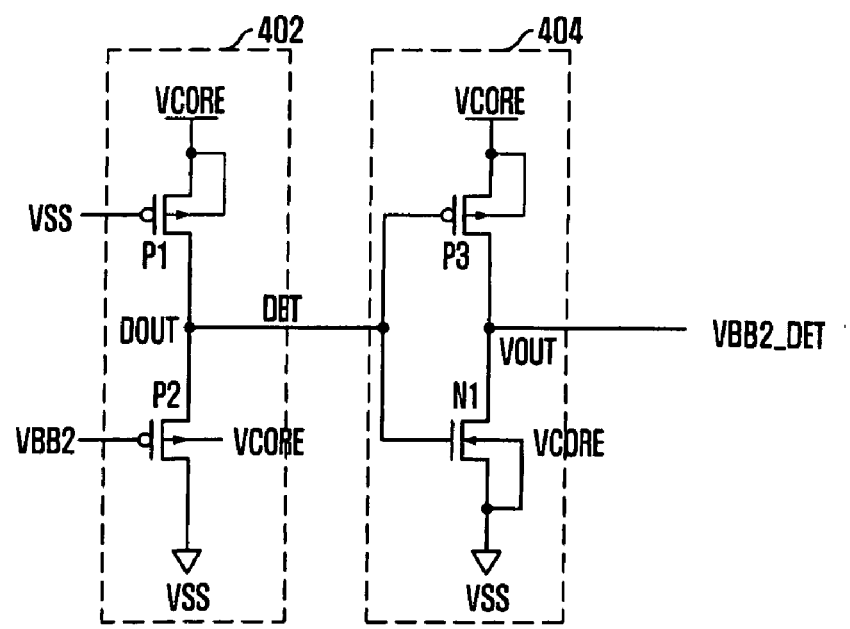
FIG. 9 is a circuit diagram of an under_drive voltage detector for detecting the under_drive voltage illustrated in FIGS. 4 and 5.

FIG. 9 is a circuit diagram of the under_drive voltage detector for detecting the under_drive voltage VBB2 illustrated in FIGS. 4 and 5.

Referring to FIG. 9, the under_drive voltage detector 400 for detecting the under_drive voltage VBB2 during the generation of the under_drive voltage VBB2 in the bitline sense amplifier circuit in accordance with the embodiment of the present invention includes a level detector 402 and a level converter 404. The level detector 402 outputs a detection voltage DET that changes in an analog fashion according to the level of the under_drive voltage VBB2. In response to a predetermined logic threshold voltage level, the level converter 404 outputs the detection voltage DET as an under_drive voltage detection signal VBB2_DET that changes logically.

The level detector 402 includes a first PMOS transistor P1 and a second PMOS transistor P2 that are connected in series between a core voltage terminal (VCORE) and a ground voltage terminal (VSS). In response to the constant-level ground voltage VSS applied to its gate, the first PMOS transistor P1 constantly maintains the size of a current that flows between the core voltage terminal (VCORE) and a detection voltage output terminal DOUT that are source-drain connected. In response to the under_drive voltage VBB2 applied to its gate, the second PMOS transistor P2 adjusts the size of a current that flows between the detection voltage output terminal DOUT and the ground voltage terminal (VSS) that are source-drain connected.

The level converter 404 includes a PMOS transistor P3 and an NMOS transistor N1 that are connected in series between the core voltage terminal (VCORE) and the ground voltage terminal (VSS). In response to the level of the detection voltage DET applied to its gate, the PMOS transistor P3 controls the connection between the power supply voltage terminal (VDD) and an under_drive voltage detection signal output terminal VOUT. In response to the level of the detection voltage DET applied to its gate, the NMOS transistor N1 controls the connection between the under_drive voltage detection signal output terminal VOUT and the ground voltage terminal (VSS).

Herein, the logic threshold voltage level serves as a criterion for determining the logic level (i.e., logic 'high' or logic 'low') of the under_drive voltage detection signal VBB2_DET. When the level of the detection signal DET is higher than the logic threshold voltage level, the under_drive voltage detection signal VBB2_DET is logically 'high'. On the other hand, when the level of the detection signal DET is lower than the logic threshold voltage level, the under_drive voltage detection signal VBB2_DET is logically 'low'.

Figure 10:
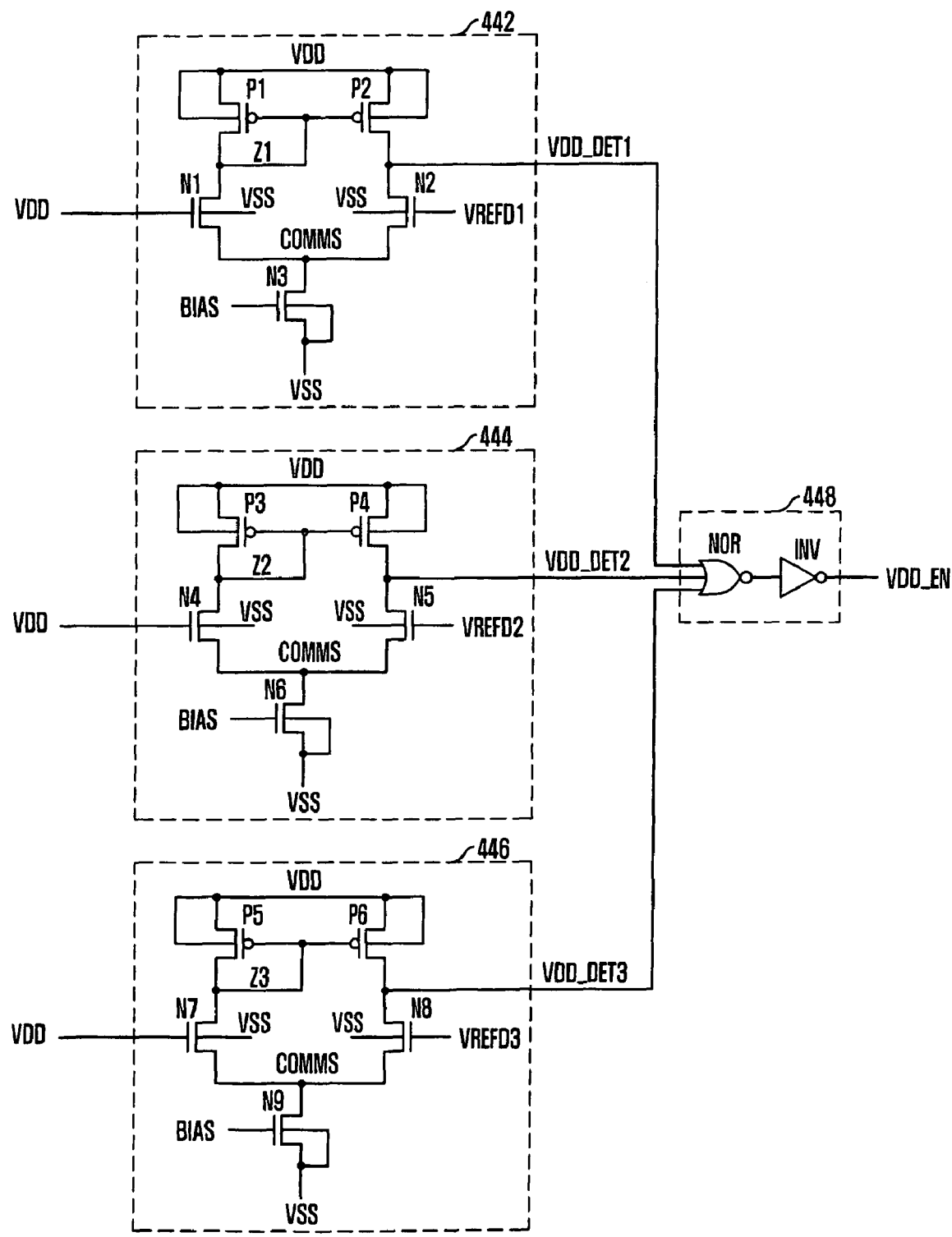
FIG. 10 is a circuit diagram of an external power supply voltage detector for detecting an external power supply voltage illustrated in FIGS. 4 and 5.

FIG. 10 is a circuit diagram of the external power supply voltage detector for detecting the external power supply voltage VDD illustrated in FIGS. 4 and 5.

Referring to FIG. 10, the external power supply voltage detector 440 for detecting the external power supply voltage VDD during the generation of the under_drive voltage VBB2 in the bitline sense amplifier circuit in accordance with the embodiment of the present invention includes a plurality of comparators 442, 444 and 446. The comparator 442 compares the level of the external power supply voltage VDD with the level of a reference voltage VREFD1 to output an external voltage detection signal VDD_DET1 that has a logic level determined according to the comparison results. Similarly, the comparator 444 compares the level of the external power supply voltage VDD with the level of a reference voltage VREFD2 to output an external voltage detection signal VDD_DET2 that has a logic level determined according to the comparison results. Likewise, the comparator 446 compares the level of the external power supply voltage VDD with the level of a reference voltage VREFD3 to output an external voltage detection signal VDD_DET3 that has a logic level determined according to the comparison results. Herein, the reference voltages VREFD1, VREFD2 and VREFD3 have different target voltages.

The external power supply voltage detector 440 further includes an external voltage detection signal output unit 448. The external voltage detection signal output unit 448 outputs one external voltage detection signal VDD_DET so that the second under_drive voltage driver 426 corresponding to the external power supply voltage detector 440 can operate even when only one of the external voltage detection signals VDD_DET1, VDD_DET2 and VDD_DET3 is activated.

The use of the above-described embodiments of the present invention can generate the under_drive voltage VBB2 by the variable driving force in response to each bank active signal in the semiconductor memory device using an under_drive technique.

Thus, a waste of current can be reduced in comparison with the case where the under_drive voltage VBB2 is always generated by the constant driving force regardless of the operation of the semiconductor memory device.

Also, the under_drive voltage VBB2 can be generated by the variable driving force that varies according to the detected level of the external power supply voltage VDD. Thus, the under_drive voltage VBB2 can be generated by the stable driving force even when the level of the external power supply voltage VDD changes unstably due to a change in the PVT (process, voltage and temperature) of the semiconductor memory device.

Also, due to the stable under_drive operation, the bitline sense/amplification operation can be performed stably even when a low-level external power supply voltage is input into the semiconductor memory device.

As described above, the present invention generates the under_drive voltage VBB2 by the variable driving force in response to the operation of the semiconductor memory device using an under_drive technique and the level of the external power supply voltage, thereby making it possible to generate the under_drive voltage VBB2 that always maintains a predetermined level.

Thus, it is possible to reduce a waste of current that may occur during the generation of the under_drive voltage VBB2.

While the present invention has been described with respect to the specific embodiments, it will be apparent to those skilled in the art that various changes and modifications may be made without departing from the spirit and scope of the invention as defined in the following claims. For example, the locations and types of the logic gates and the transistors illustrated in the above embodiments can be implemented differently according to the polarities of input signals.

What is claimed is:

1. A semiconductor memory device comprising:
    a bitline sense amplifier configured to sense/amplify data loaded on a bitline and perform a pull-down driving operation using a normal pull-down driving voltage and an under_drive voltage having a lower level than the normal pull-down driving voltage;
    an external power supply voltage detector configured to detect a level of an external power supply voltage to generate the external voltage detection signal;
    an under_drive voltage detector configured to detect a voltage level of the under_drive voltage to generate the under_drive voltage detection signal; and
    an under_drive voltage generator configured to generate the under_drive voltage in response to the under_drive voltage detection signal with a variable driving force in response to the external voltage detection signal.

2. The semiconductor memory device as recited in claim 1, wherein the under_drive voltage generator includes:
    an oscillator configured to generate an oscillation signal with a predetermined frequency in response to the under_drive voltage detection signal;
    a first under_drive voltage driver configured to drive a terminal for the under_drive voltage by a first predetermined driving force in response to the oscillation signal; and
    a second under_drive voltage driver configured to drive the terminal by a second predetermined driving force in response to the external voltage detection signal and the oscillation.

3. The semiconductor memory device as recited in claim 2, wherein the first under_drive voltage driver includes:
an under_drive voltage pumping unit configured to drive the terminal by the first predetermined driving force by performing a charge pumping operation in response to the oscillation signal.

4. The semiconductor memory device as recited in claim 3, wherein the under_drive voltage pumping unit includes:
a first capacitor connected in series to a signal input terminal such that a change in the voltage level of the signal input terminal occurs at a pumping control node at a rate corresponding to a first predetermined time constant ($\tau$);
a first diode-connected NMOS transistor connected in series between the pumping control node and a ground voltage terminal;
a second diode-connected NMOS transistor connected in series between the pumping control node and the terminal for the under_drive voltage connected in series to the ground voltage terminal; and
a second capacitor connected in series between the terminal for the under_drive voltage and the ground voltage terminal such that a change in the voltage level of the terminal for the under_drive voltage occurs at a rate corresponding to a second predetermined time constant.

5. The semiconductor memory device as recited in claim 2, wherein the second under_drive voltage driver includes:
a transfer control unit configured to control the transfer of the oscillation signal in response to the external voltage detection signal; and
an under_drive voltage pumping unit configured to drive the terminal by the second predetermined driving force by performing a charge pumping operation in response to an output signal of the transfer control unit.

6. The semiconductor memory device as recited in claim 5, wherein the transfer control unit includes:
a first inverter configured to invert the external voltage detection signal;
a second inverter configured to invert an output signal of the first inverter;
a third inverter configured to selectively transfer the oscillation signal, which is applied to an input terminal, to an output terminal in response to the output signal of the first inverter that is received through a negative control terminal and an output signal of the second inverter that is received through a positive control terminal; and
a latch connected in series to the output terminal to prevent a floating of the oscillation signal and invert a phase of the oscillation signal.

7. The semiconductor memory device as recited in claim 2, wherein the oscillator includes:
a NOR gate configured to perform a NOR operation on a feedback oscillation signal and the under_drive voltage detection signal;
an oscillation signal output unit including a chain of inverters connected in series to output the oscillation signal by delaying an output signal of the NOR gate by a predetermined time; and
a feedback oscillation signal output unit including a chain of inverters that are connected in series to output the feedback oscillation signal by delaying the oscillation signal from the oscillation signal output unit by a predetermined time.

8. The semiconductor memory device as recited in claim 1, wherein the under_drive voltage detector includes:
a level detector configured to output a detection voltage that changes in an analog fashion according to the level of the under_drive voltage; and
a level converter configured to output the detection voltage as the under_drive voltage detection signal that changes logically, in response to a predetermined logic threshold voltage level.

9. The semiconductor memory device as recited in claim 8, wherein the level detector includes:
a first PMOS transistor and a second PMOS transistor that are connected in series between a core voltage terminal and a ground voltage terminal,
the first PMOS transistor being configured to constantly maintain the size of a current that flows between the core voltage terminal and a detection voltage output terminal that are source-drain connected, in response to a constant-level ground voltage applied to a gate of the first PMOS transistor, and
the second PMOS transistor being configured to adjust the size of a current that flows between the detection voltage output terminal and the ground voltage terminal that are source-drain connected, in response to the under_drive voltage applied to a gate of the second PMOS transistor.

10. The semiconductor memory device as recited in claim 8, wherein the level converter includes:
a PMOS transistor and an NMOS transistor that are connected in series between a core voltage terminal and a ground voltage terminal,
the PMOS transistor being configured to control a connection between a power supply voltage terminal and an under_drive voltage detection signal output terminal, in response to the level of the detection voltage applied to a gate of the PMOS transistor, and
the NMOS transistor being configured to control the connection between the under_drive voltage detection signal output terminal and a ground voltage terminal, in response to the level of the detection voltage applied to a gate of the NMOS transistor.

11. The semiconductor memory device as recited in claim 1, wherein the external power supply voltage detector includes:
a plurality of comparators each configured to compare the level of the external power supply voltage with the level of a reference voltage to output the external voltage detection signal that has a logic level determined according to the comparison results, the reference voltages for the comparators having different target levels.

12. A semiconductor memory device comprising:
a plurality of banks each having a bitline sense amplifier configured to sense/amplify data loaded on a bitline and perform a pull-down driving operation using a normal pull-down driving voltage of and an under_drive voltage having a lower level than the normal pull-down driving voltage;
an external power supply voltage detector configured to detect the level of an external power supply voltage to generate an external voltage detection signal;
an under_drive voltage detector configured to detect the voltage level of an under_drive voltage to generate an under_drive voltage detection signal; and
an under_drive voltage generator configured to generate the under_drive voltage in response to the under_drive voltage detection signal with a variable driving force in response to the external voltage detection signal and an active signal corresponding to an active operation of each of the banks.

13. The semiconductor memory device as recited in claim 12, wherein the under_drive voltage generator includes:

an oscillator configured to generate an oscillation signal with a predetermined frequency in response to the under_drive voltage detection signal;

a first under_drive voltage driver configured to drive the terminal for the under_drive voltage by a first predetermined driving force in response to the oscillation signal;

a second under_drive voltage driver configured to drive the terminal by a second predetermined driving force in response to the external voltage detection signal and the oscillation signal; and a third under_drive voltage driver configured to drive the terminal by a third variable driving force in response to the oscillation signal and the corresponding active signal.

14. The semiconductor memory device as recited in claim 13, wherein the first under_drive voltage driver includes:

an under_drive voltage pumping unit configured to drive the terminal by the first predetermined driving force by performing a charge pumping operation in response to the oscillation signal.

15. The semiconductor memory device as recited in claim 14, wherein the under_drive voltage pumping unit includes:

a first capacitor connected in series to a signal input terminal such that a change in the voltage level of the signal input terminal occurs at a pumping control node at a rate corresponding to a first predetermined time constant ($\tau$);

a first diode-connected NMOS transistor connected in series between the pumping control node and a ground voltage terminal;

a second diode-connected NMOS transistor connected in series between the pumping control node and an under_drive voltage terminal connected in series to the ground voltage terminal; and a second capacitor connected in series between the under_drive voltage terminal and the ground voltage terminal such that a change in the voltage level of the under_drive voltage terminal occurs at a rate corresponding to a second predetermined time constant.

16. The semiconductor memory device as recited in claim 13, wherein the second under_drive voltage driver includes:

a transfer control unit configured to control the transfer of the oscillation signal in response to the external voltage detection signal; and an under_drive voltage pumping unit configured to drive the terminal by the second predetermined driving force by performing a charge pumping operation in response to an output signal of the transfer control unit.

17. The semiconductor memory device as recited in claim 13, wherein the third under_drive voltage driver includes:

a plurality of transfer control units each configured to control the transfer of the oscillation signal in response to the corresponding active signal; and a plurality of under_drive voltage pumping units each configured to drive the terminal by the third variable driving force by performing a charge pumping operation in response to an output signal of the corresponding transfer control unit.

18. The semiconductor memory device as recited in claim 16, wherein the transfer control unit includes:

a first inverter configured to invert the external voltage detection signal;

a second inverter configured invert an output signal of the first inverter;

a third inverter configured to selectively transfer the oscillation signal, which is applied to an input terminal, to an output terminal in response to the output signal of the first inverter that is received through a negative control terminal and an output signal of the second inverter that is received through a positive control terminal; and a latch connected in series to the output terminal to prevent a floating of the oscillation signal and invert a phase of the oscillation signal.

19. The semiconductor memory device as recited in claim 17, wherein the transfer control unit includes:

a first inverter configured to invert one of the active signals;

a second inverter configured to invert an output signal of the first inverter;

a third inverter configured to selectively transfer the oscillation signal, which is applied to an input terminal, to an output terminal in response to the output signal of the first inverter that is received through a negative control terminal and an output signal of the second inverter that is received through a positive control terminal; and a latch connected in series to the output terminal to prevent a floating of the oscillation signal and invert a phase of the oscillation signal.

20. The semiconductor memory device as recited in claim 13, wherein the oscillator includes:

a NOR gate configured to perform a NOR operation on a feedback oscillation signal and the under_drive voltage detection signal;

an oscillation signal output unit including a chain of inverters connected in series to output the oscillation signal by delaying an output signal of the NOR gate by a predetermined time; and a feedback oscillation signal output unit including a chain of inverters that are connected in series to output the feedback oscillation signal by delaying the oscillation signal from the oscillation signal output unit by a predetermined time.

21. The semiconductor memory device as recited in claim 12, wherein the under_drive voltage detector includes:

a level detector configured to output a detection voltage that changes in an analog fashion according to the level of the under_drive voltage; and a level converter configured to output the detection voltage as the under_drive voltage detection signal that changes logically, in response to a predetermined logic threshold voltage level.

22. The semiconductor memory device as recited in claim 21, wherein the level detector includes:

a first PMOS transistor and a second PMOS transistor that are connected in series between a core voltage terminal and a ground voltage terminal, the first PMOS transistor being configured to constantly maintain the size of a current that flows between the core voltage terminal and a detection voltage output terminal that are source-drain connected, in response to a constant-level ground voltage applied to a gate of the first PMOS transistor, and the second PMOS transistor being configured to adjust the size of a current that flows between the detection voltage output terminal and the ground voltage terminal that are source-drain connected, in response to the under_drive voltage applied to a gate of the second PMOS transistor.

23. The semiconductor memory device as recited in claim 21, wherein the level converter includes:

a PMOS transistor and an NMOS transistor that are connected in series between a core voltage terminal and a ground voltage terminal, the PMOS transistor being configured to control the connection between a power supply voltage terminal and an under_drive voltage detection signal output terminal, in response to the level of the detection voltage applied to a gate of the PMOS transistor, and the NMOS transistor being configured to control the connection between the under_drive voltage detection signal output terminal and the ground voltage terminal, in response to the level of the detection voltage applied to a gate of the NMOS transistor.

24. The semiconductor memory device as recited in claim 12, wherein the external power supply voltage detector includes:

a plurality of comparators each configured to compare the level of the external power supply voltage with the level of a reference voltage to output the external voltage detection signal that has a logic level determined according to the comparison results, the reference voltages for the comparators having different target levels.

25. A method for driving a semiconductor memory device, comprising:

sensing/amplifying data loaded on a bitline through performing a pull-down driving operation using a normal pull-down driving voltage and an under_drive voltage having a lower level than the normal pull-down driving voltage;

detecting the level of an external power supply voltage to generate an external voltage detection signal;

detecting the level of an under_drive voltage to generate an under_drive voltage detection signal; and generating the under_drive voltage in response to the under_drive voltage detection signal with a variable driving force in response to the external voltage detection signal.

26. The method as recited in claim 25, wherein the generating of the under_drive voltage includes:

generating an oscillation signal with a predetermined frequency in response to the under_drive voltage detection signal;

driving a terminal for the under_drive voltage by a first predetermined driving force in response to the oscillation signal; and driving the terminal by a second predetermined driving force in response to the oscillation signal and the external voltage detection signal.

27. The method as recited in claim 26, wherein the driving of the terminal by the first predetermined driving force includes:

driving the terminal by the first predetermined driving force by performing a charge pumping operation in response to the oscillation signal.

28. The method as recited in claim 26, wherein the driving of the terminal by the second predetermined driving force includes:

controlling the transfer of the oscillation signal in response to the external voltage detection signal; and driving the terminal by the second predetermined driving force by performing a charge pumping operation in response to an output signal resulting from the controlling of the transfer of the oscillation signal.

29. The method as recited in claim 25, wherein the generating of the under_drive voltage detection signal includes:

outputting a detection voltage that changes in an analog fashion according to the level of the under_drive voltage; and outputting the detection voltage as the under_drive voltage detection signal that changes logically, in accordance with a predetermined logic threshold voltage level.

30. The method as recited in claim 25, wherein the generating of the external voltage detection signal includes:

comparing the level of the external power supply voltage with the level of each of reference voltages having different target levels; and outputting the external voltage detection signal that has a logic level determined according to the comparison results.

* * * * *